(12) United States Patent
Oshima et al.

(10) Patent No.: US 8,217,491 B2
(45) Date of Patent: Jul. 10, 2012

(54) SEMICONDUCTOR DEVICE

(75) Inventors: Masashi Oshima, Kanagawa (JP);
Masaya Ohtsuka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 103 days.

(21) Appl. No.: 12/888,640

(22) Filed: Sep. 23, 2010

(65) Prior Publication Data

US 2011/0079873 A1    Apr. 7, 2011

(30) Foreign Application Priority Data

Oct. 2, 2009   (JP) ................... 2009-230167

(51) Int. Cl.
*H01L 29/00* (2006.01)
(52) U.S. Cl. ...................................... 257/529
(58) Field of Classification Search .............. 257/529, 257/E21.592, E23.149; 438/132, 601
See application file for complete search history.

(56) References Cited

U.S. PATENT DOCUMENTS

| | | | |
|---|---|---|---|
| 5,808,363 A | 9/1998 | Watanabe | |
| 5,990,537 A | 11/1999 | Endo et al. | |
| 6,015,210 A | 1/2000 | Kanematsu et al. | |
| 6,050,681 A | 4/2000 | Yamashita et al. | |
| 6,525,398 B1 * | 2/2003 | Kim et al. | 257/529 |
| 6,554,412 B1 | 4/2003 | Seino et al. | |
| 2004/0100540 A1 | 5/2004 | Hatasa et al. | |
| 2005/0068385 A1 | 3/2005 | Nanjo et al. | |
| 2008/0094448 A1 | 4/2008 | Sugahara | |

FOREIGN PATENT DOCUMENTS

| | | |
|---|---|---|
| EP | 1090767 A2 | 4/2001 |
| EP | 1835213 A1 | 9/2007 |
| GB | 2326846 A | 1/1999 |
| JP | 9-139431 | 5/1997 |
| JP | 2695548 | 9/1997 |

OTHER PUBLICATIONS

Nov. 26, 2011 European search report in connection with counterpart European patent application No. 10 25 1629.

* cited by examiner

*Primary Examiner* — Quoc Hoang
(74) *Attorney, Agent, or Firm* — Cooper & Dunham LLP

(57) ABSTRACT

A semiconductor device includes a base insulating film on which a silicon fuse, silicon wiring patterns, and a silicon guard ring are formed. The silicon guard ring surrounds the silicon fuse and has silicon cutout parts so as not to contact the silicon wiring patterns. A via guard ring, which has via cutout parts located above the silicon cutout parts, is formed in an interlayer insulating film and on the silicon guard ring. A metal wiring guard ring is formed on the via guard ring and the interlayer insulating film. A silicon nitride film is formed on the interlayer insulating film so as to cover the metal wiring guard ring. An interface between the interlayer insulating film and the metal wiring guard ring at the via cutout parts is covered by the silicon nitride film.

4 Claims, 4 Drawing Sheets

(D-D')

(A-A')

(B-B')

(C-C')

(D-D')

(X-X')

(Y-Y')

US 8,217,491 B2

SEMICONDUCTOR DEVICE

BACKGROUND OF THE INVENTION

1. Field of the Invention

The present invention relates to semiconductor devices, and more particularly to a semiconductor device including a silicon fuse, a fuse opening formed in insulating films above the silicon fuse, and a guard ring surrounding the silicon fuse.

2. Description of the Related Art

A fuse formed by a silicon film pattern (referred to as a silicon fuse) is widely used for redundancy circuits, programming, and changing setting voltages by adjusting resistance values. An insulating film is formed on an IC (integrated circuit) chip having a fuse. The part of the insulating film above the silicon fuse is made thinner than other parts of the insulating film so that a fuse opening is formed for disconnecting the fuse.

The problem with such an IC chip with a fuse is that moisture may enter through the fuse opening, which may impair the reliability and degrade the properties over time. Conventionally, various measures have been taken in order to prevent such failures. A typical method is to provide a guard ring around the silicon fuse (see, for example, Japanese patent no. 2695548).

FIGS. 6 through 8 schematically illustrate a conventional semiconductor device having a silicon fuse and a guard ring. FIG. 6 is a plan view, FIG. 7 is a cross-sectional view cut along a line X-X' in FIG. 6, and FIG. 8 is a cross-sectional view cut along a line Y-Y' in FIG. 6. In FIG. 6, the layer structures above the silicon film pattern are not shown, except for the position of the fuse opening.

A base insulating film 103 is formed on a semiconductor substrate 101. On the base insulating film 103, a silicon fuse 105 made of a silicon film, two silicon wiring patterns 107, and a silicon guard ring 109 are formed.

The two silicon wiring patterns 107 are connected to the ends of the silicon fuse 105.

The silicon guard ring 109 is disposed in such a manner as to surround the silicon fuse 105. The silicon guard ring 109 has cutout parts 109A at positions intersecting the silicon wiring patterns 107, so that the silicon guard ring 109 is insulated from the silicon wiring patterns 107.

An interlayer insulating film 111 (interlayer silicon film between silicon layer and metal wiring layer) is formed on the base insulating film 103 in such a manner as to cover the silicon fuse 105, the silicon wiring patterns 107, and the silicon guard ring 109.

A contact hole is formed in the interlayer insulating film 111 and on the silicon guard ring 109, so as to be formed along the position of the silicon guard ring 109. A metal material is implanted into the contact hole so that a first via guard ring 113 is formed. The contact hole and the first via guard ring 113 are not formed above the silicon wiring patterns 107 or the cutout parts 109A, so that the first via guard ring 113 is insulated from the silicon wiring patterns 107. The interlayer insulating film 111 is positioned above the silicon wiring patterns 107 and the cutout parts 109A, because the contact hole and the first via guard ring 113 are not formed above the silicon wiring patterns 107 or the cutout parts 109A.

A first metal wiring guard ring 115 made of a metal material is formed on the interlayer insulating film 111 and the first via guard ring 113. The first metal wiring guard ring 115 is formed in a ring shape surrounding the silicon fuse 105, along the positions of the silicon guard ring 109 and the cutout parts 109A.

An interlayer insulating film 117 (inter-metal-wiring-layer insulating film) is formed on the interlayer insulating film 111 in such a manner as to cover the first metal wiring guard ring 115.

A via hole is formed in the interlayer insulating film 117 and along the first metal wiring guard ring 115. A metal material is implanted into the via hole so that a second via guard ring 119 is formed. The second via guard ring 119 is formed in a ring shape along the first metal wiring guard ring 115.

A second metal wiring guard ring 121 made of a metal material is formed on the interlayer insulating film 117 and the second via guard ring 119. The second metal wiring guard ring 121 is formed in a ring shape along the second via guard ring 119.

A final protection film 123 is formed on the interlayer insulating film 117, in such a manner as to cover the second metal wiring guard ring 121.

The part of the insulating films above the silicon fuse 105 is made thinner than other parts of the insulating films so that a fuse opening 125 is formed.

As shown in FIG. 7, the first via guard ring 113 is partially cut out, in order to prevent a short circuit between the first via guard ring 113 and the silicon wiring patterns 107. The interlayer insulating film 111 is positioned at the cutout parts of the first via guard ring 113. The interface between the interlayer insulating film 111 and the first metal wiring guard ring 115 becomes a moisture transfer path extending from the fuse opening 125 to an internal circuit (not shown) provided outside the first metal wiring guard ring 115. Accordingly, a factor having an adverse impact on the reliability of the IC enters the internal circuit.

SUMMARY OF THE INVENTION

The present invention provides a semiconductor device, in which one or more of the above-described disadvantages are eliminated.

A preferred embodiment of the present invention provides a semiconductor device capable of tightly preventing moisture, etc., from being transferred from a fuse opening to the outside of a guard ring.

According to an aspect of the present invention, there is provided a semiconductor device including a base insulating film formed on a semiconductor substrate; a silicon fuse formed on the base insulating film; two silicon wiring patterns formed on the base insulating film, each of the two silicon wiring patterns being connected to either end of the silicon fuse; a silicon guard ring formed on the base insulating film so as to surround the silicon fuse, the silicon guard ring having silicon cutout parts such that the silicon guard ring does not contact the two silicon wiring patterns; an interlayer insulating film formed on the base insulating film so as to cover the silicon fuse, the two silicon wiring patterns, and the silicon guard ring; a first via guard ring made of metal that is implanted into a first via hole formed in the interlayer insulating film and on the silicon guard ring so as to surround the silicon fuse as viewed from the top, the first via guard ring having via cutout parts at positions above the silicon cutout parts; a metal wiring guard ring having a ring shape and made of metal formed on the first via guard ring and the interlayer insulating film so as to surround the silicon fuse as viewed from the top; a silicon nitride film formed on the interlayer insulating film so as to cover the metal wiring guard ring; a final protection film made of a final insulating film formed on the silicon nitride film; and a fuse opening provided by forming a thin part in insulating films of the semiconductor device, the thin part being formed above the silicon fuse and inside guard rings of the semiconductor device, the insulating films including at least one of the interlayer insulating film, the silicon nitride film, and the final protection film, and the guard rings including the silicon guard ring, the first via guard ring, and the metal wiring guard ring.

According to one embodiment of the present invention, a semiconductor device is provided, which is capable of tightly preventing moisture, etc., from being transferred from a fuse opening to the outside of a guard ring.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention.

Figure 1:
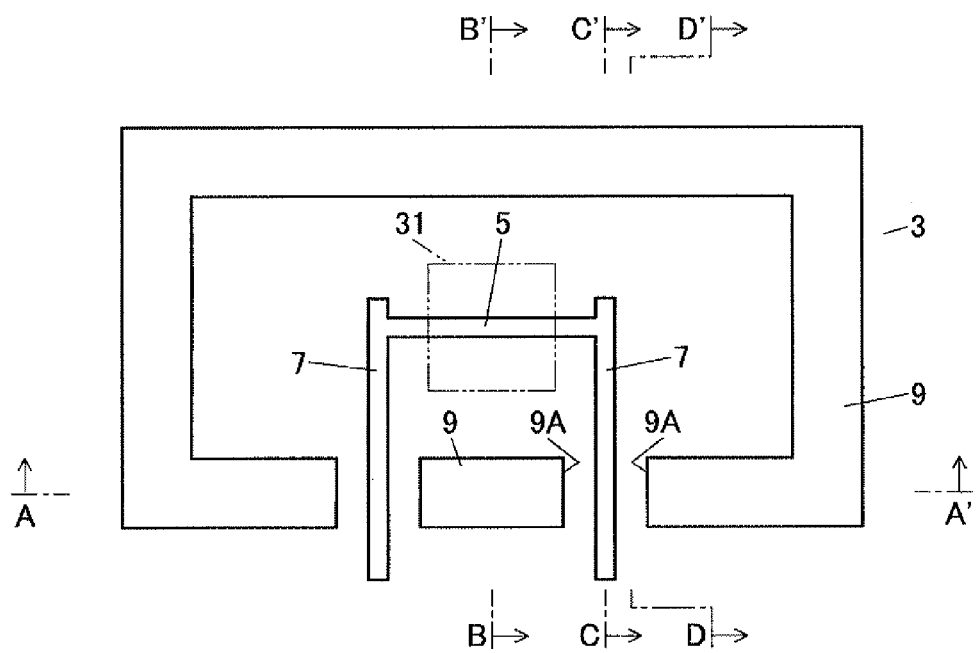
FIG. 1 is a plan view of a semiconductor device according to an embodiment of the present invention.
Figure 2:
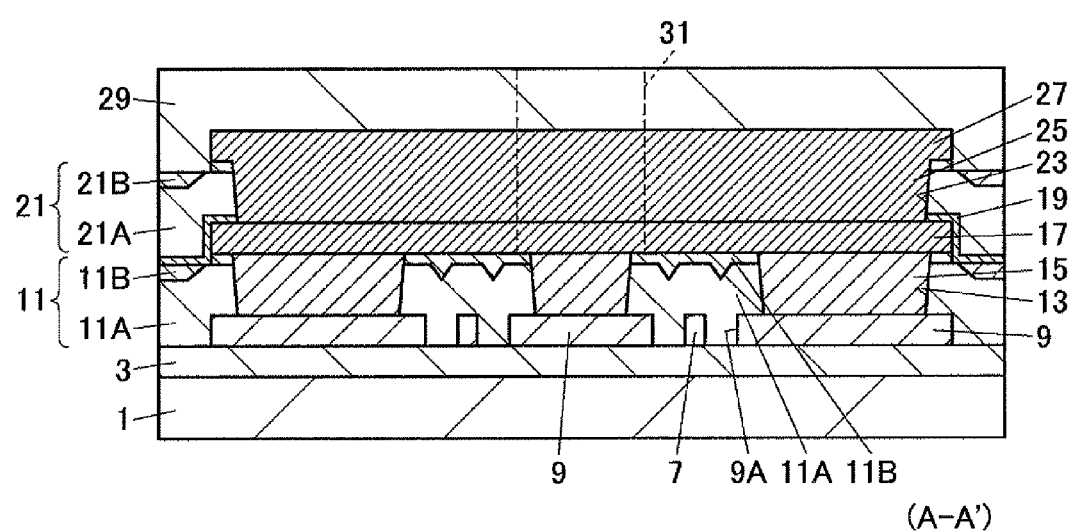
FIG. 2 is a cross-sectional view cut along a line A-A' in FIG. 1.
Figure 3:
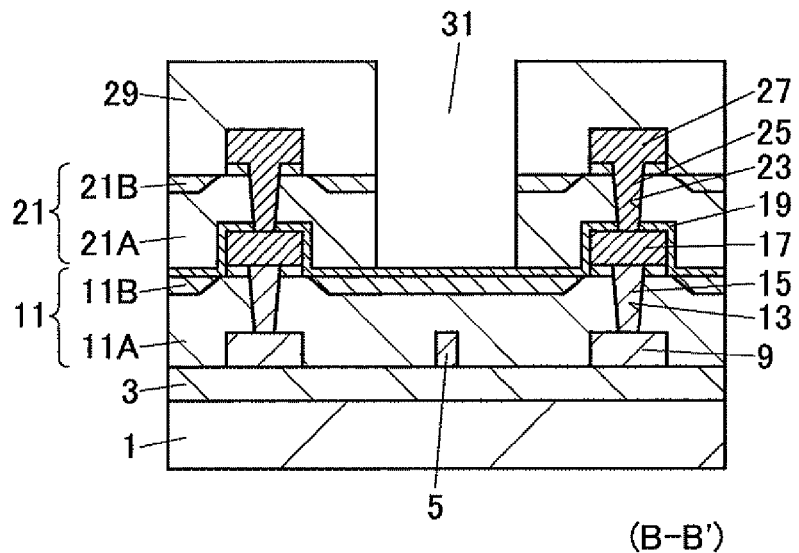
FIG. 3 is a cross-sectional view cut along a line B-B' in FIG. 1.
Figure 4:
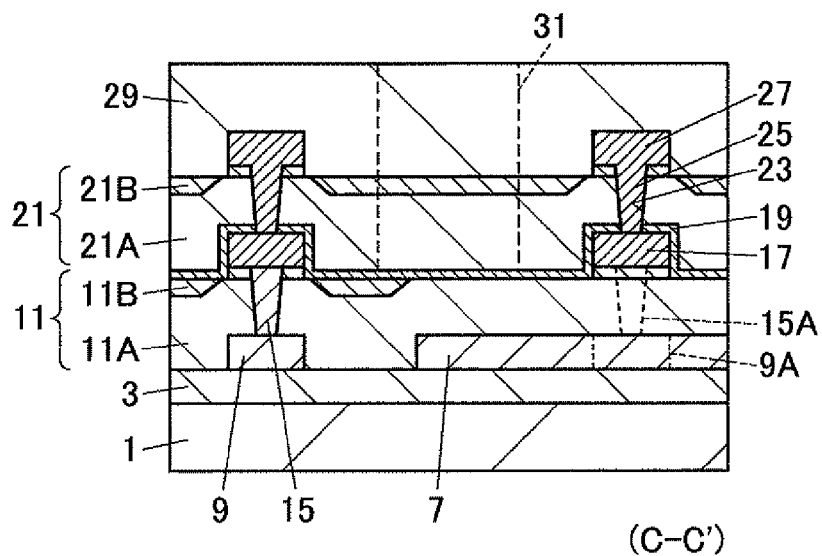
FIG. 4 is a cross-sectional view cut along a line C-C' in FIG. 1.
Figure 5:
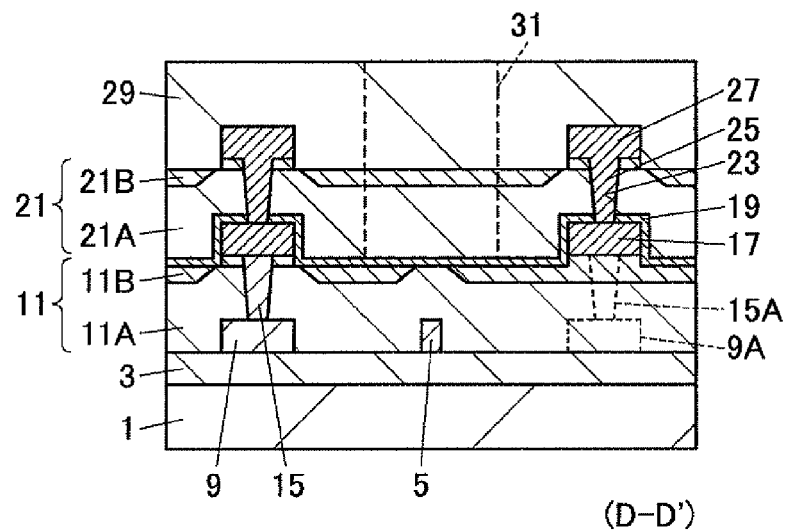
FIG. 5 is a cross-sectional view cut along a line D-D' in FIG. 1.
Figure 6:
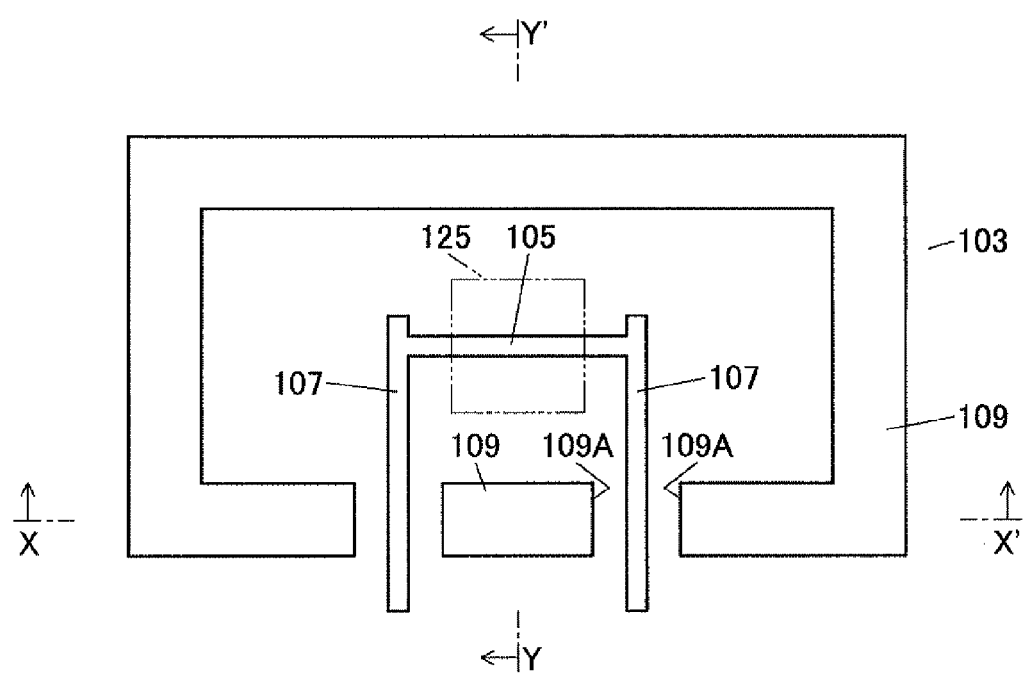
FIG. 6 is a plan view of a conventional semiconductor device.
Figure 7:
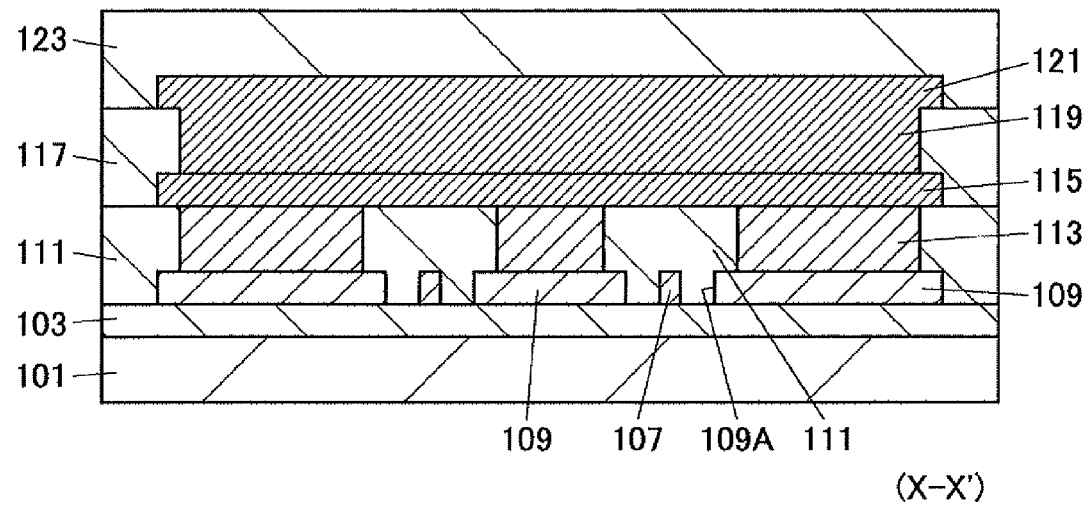
FIG. 7 is a cross-sectional view cut along a line X-X' in FIG. 6.
Figure 8:
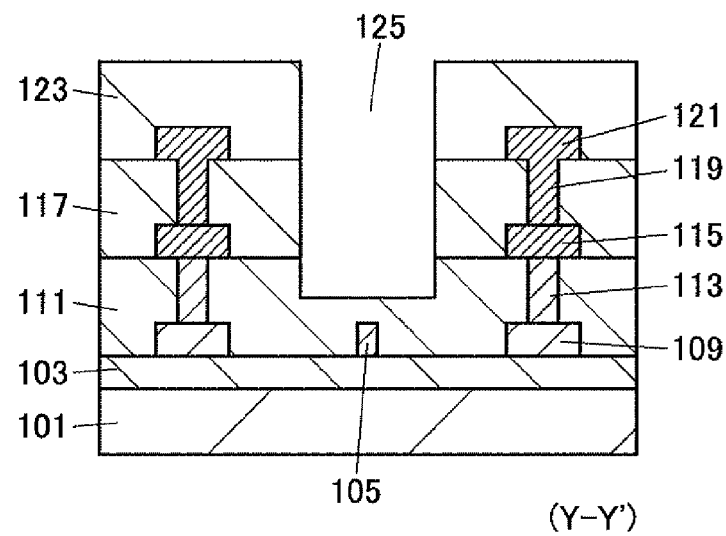
FIG. 8 is a cross-sectional view cut along a line Y-Y' in FIG. 6.

FIGS. 1 through 5 schematically illustrate a semiconductor device according to an embodiment of the present invention. FIG. 1 is a plan view, FIG. 2 is a cross-sectional view cut along a line A-A' in FIG. 1, FIG. 3 is a cross-sectional view cut along a line B-B' in FIG. 1, FIG. 4 is a cross-sectional view cut along a line C-C' in FIG. 1, and FIG. 5 is a cross-sectional view cut along a line D-D' in FIG. 1. In FIG. 1, the layer structures above the silicon film pattern are not shown, except for the position of the fuse opening.

A base insulating film 3 is formed on a semiconductor substrate 1. The base insulating film 3 is made of, for example, a LOCOS (local oxidation of silicon) film. On the base insulating film 3, a silicon fuse 5, two silicon wiring patterns 7, and a silicon guard ring 9 are formed. The silicon fuse 5 is made of a polysilicon film pattern having a thickness of 0.1 μm through 0.5 μm (micrometers).

Each of the two silicon wiring patterns 7 is connected to either end of the silicon fuse 5.

The silicon guard ring 9 is disposed in such a manner as to surround the silicon fuse 5. The silicon guard ring 9 has cutout parts 9A at positions intersecting the silicon wiring patterns 7, so that the silicon guard ring 9 is insulated from the silicon wiring patterns 7.

An interlayer insulating film 11 (interlayer silicon film between silicon layer and metal wiring layer) is formed on the base insulating film 3 in such a manner as to cover the silicon fuse 5, the silicon wiring patterns 7, and the silicon guard ring 9. For example, the interlayer insulating film 11 is made of a BPSG film 11A having a thickness of 0.5 μm through 1.0 μm and an SOG film 11B formed on the BPSG film 11A.

A contact hole 13 is formed in the interlayer insulating film 11 above the silicon guard ring 9, so as to surround the silicon fuse 5 as viewed from the top. The contact hole 13 in the interlayer insulating film 11 is not formed above the cutout parts 9A.

A metal material such as tungsten is implanted into the contact hole 13 so that a first via guard ring 15 is formed. The first via guard ring 15 surrounds the silicon fuse 5 as viewed from the top. The first via guard ring 15 has via cutout parts 15A formed above the cutout parts 9A.

A first metal wiring guard ring 17 made of a metal material is formed on the interlayer insulating film 11 and the first via guard ring 15. The first metal wiring guard ring 17 is formed in a ring shape surrounding the silicon fuse 5 as viewed from the top. For example, the first metal wiring guard ring 17 is made of aluminum having a thickness of 0.5 μm through 1.0 μm.

The interlayer insulating film 11 is partially removed by an etching process performed when patterning the first metal wiring guard ring 17. Specifically, the front surface of the interlayer insulating film 11 is partially removed at parts that are not covered by the first metal wiring guard ring 17. In the present embodiment, the SOG film 11B is formed under the first metal wiring guard ring 17; however, there may be cases where there is no SOG film 11B formed under the first metal wiring guard ring 17.

A silicon nitride film 19 is formed on the interlayer insulating film 11 in such a manner as to cover the first metal wiring guard ring 17. For example, the silicon nitride film 19 has a thickness of 0.05 μm through 0.2 μm. The silicon nitride film 19 covers the interface between the interlayer insulating film 11 and the first metal wiring guard ring 17.

An interlayer insulating film 21 (inter-metal-wiring-layer insulating film) is formed on the silicon nitride film 19. For example, the interlayer insulating film 21 is made of a TEOS (Tetra Ethyl Ortho Silicate) film 21A and an SOG film 21B formed on the TEOS film 21A.

A via hole 23 is formed in the silicon nitride film 19 and the interlayer insulating film 21, on the first metal wiring guard ring 17. The via hole 23 is formed in a ring shape surrounding the silicon fuse 5 as viewed from the top.

A metal film is formed in the via hole 23 and on the interlayer insulating film 21. Accordingly, a second via guard ring 25 is formed in the via hole 23 and a second metal wiring guard ring 27 is formed on the second via guard ring 25 and the interlayer insulating film 21. The second via guard ring 25 and the second metal wiring guard ring 27 are formed in a ring shape surrounding the silicon fuse 5 as viewed from the top. For example, the second via guard ring 25 and the second metal wiring guard ring 27 are made of aluminum having a thickness of 0.5 μm through 1.0 μm. In the present example, the second via guard ring 25 and the second metal wiring guard ring 27 are made of the same material; however, the second via guard ring 25 and the second metal wiring guard ring 27 may be made of different materials.

The interlayer insulating film 21 is partially removed by an etching process performed when patterning the second metal wiring guard ring 27. Specifically, the front surface of the interlayer insulating film 21 is partially removed at parts that are not covered by the second metal wiring guard ring 27. In the present embodiment, the SOG film 21B is formed under the second metal wiring guard ring 27; however, there may be cases where there is no SOG film 21B formed under the second metal wiring guard ring 27.

A final protection film 29 is formed on the interlayer insulating film 21, in such a manner as to cover the second metal wiring guard ring 27. For example, the final protection film 29 may be made of a silicon oxide film and a silicon nitride film that are laminated to each other, or the final protection film 29 may be made of a single silicon nitride film.

The part of the insulating films above the silicon fuse 5 is made thinner than other parts of the insulating films so that a fuse opening 31 is formed. In the present embodiment, the fuse opening 31 is a through hole formed in the final protection film 29 and the interlayer insulating film 21, and above the silicon nitride film 19. The fuse opening 31 may have any depth. For example, the fuse opening 31 may include a through hole formed in the final protection film 29, the interlayer insulating film 21, and the silicon nitride film 19, and a recessed part formed on the surface of the interlayer insulating film 11 below the through hole. In another example, the fuse opening 31 may have a depth that does not reach the silicon nitride film 19.

In areas not shown in FIGS. 1 through 5, there are various elements formed on the semiconductor substrate 1 and the base insulating film 3. Examples of the elements are semiconductor devices such as a transistor, a capacitative element, and a resistive element, as well as internal circuits. Furthermore, in areas not shown in FIGS. 1 through 5, via holes and metal wiring patterns are formed at the same time as forming the first via guard ring 15, the second via guard ring 25, the first metal wiring guard ring 17, and the second metal wiring guard ring 27.

In the present embodiment, the fuse opening 31 is formed above the silicon nitride film 19 before the fuse is disconnected. Therefore, the interlayer insulating film 11 is not exposed to the fuse opening 31, and moisture, etc., is tightly prevented from being transferred from the fuse opening 31 to the outside of the guard ring.

Even after the fuse is disconnected, moisture, etc., is tightly prevented from being transferred from the fuse opening 31 to the outside of the guard ring, due to the following configuration. At the cutout parts 9A and the via cutout parts 15A, the part of the interlayer insulating film 11 inside the guard ring and the part of the interlayer insulating film 11 outside the guard ring are connected. At the cutout parts 9A and the via cutout parts 15A, the interface between the interlayer insulating film 11 and the first metal wiring guard ring 17 is covered by the silicon nitride film 19 which is a dense film.

Accordingly, the semiconductor device according to an embodiment of the present invention has high reliability and properties that do not degrade over time.

Furthermore, the interlayer insulating film 11 includes the BPSG film 11A as the lower layer and the SOG film 11B as the upper layer, which are laminated to each other. The silicon nitride film 19 is formed on the interlayer insulating film 11 at positions outside the guard ring as well. Therefore, even if the part of the SOG film 11B located at the via cutout parts 15A becomes a moisture transfer path, the moisture being transferred along this part of the SOG film 11B is prevented from being transferred to layers higher than the silicon nitride film 19 outside the guard ring. Accordingly, the metal wiring can be prevented from corroding.

In the above embodiment, the interlayer insulating film 11 includes the BPSG film 11A as the lower layer and the SOG film 11B as the upper layer, which are laminated to each other. However, the present invention is not so limited. The interlayer insulating film may be made of other insulating films that are typically used in semiconductor devices. For example, the interlayer insulating film may be made of a single film such as a BPSG film or a PSG (Phospho Silicate Glass) film.

Furthermore, even if the depth of the fuse opening 31 reaches a film at a lower layer than the silicon nitride film 19, moisture is prevented from being transferred outside the guard ring, similar to the case of after disconnecting the fuse as described above.

According to an aspect of the present invention, at the silicon cutout parts and the via cutout parts, the part of the interlayer insulating film inside the guard ring and the part of the interlayer insulating film outside the guard ring are connected. At the silicon cutout parts and the via cutout parts, the interface between the interlayer insulating film and the metal wiring guard ring is covered by a silicon nitride film which is a dense film. Accordingly, moisture, etc., is tightly prevented from being transferred from a fuse opening to the outside of a guard ring of a semiconductor device, thus providing a semiconductor device having high reliability and properties that do not degrade over time.

According to an aspect of the present invention, the interlayer insulating film includes a BPSG film as a lower layer and an SOG film as an upper layer which are laminated to each other, and the nitride film is also formed on portions of the interlayer insulating film outside the guard rings. Therefore, even if the part of the SOG film located at the via cutout parts becomes a moisture transfer path, the moisture being transferred along this part of the SOG film is prevented from being transferred to layers higher than the silicon nitride film outside the guard ring. Accordingly, the metal wiring in the semiconductor device can be prevented from corroding.

According to an aspect of the present invention, the fuse opening is formed above the silicon nitride film, and therefore the interlayer insulating film is prevented from being exposed to the fuse opening. Accordingly, moisture, etc., is even more tightly prevented from being transferred from the fuse opening to the outside of the guard ring of the semiconductor device, which is particularly effective before disconnecting the fuse.

According to an aspect of the present invention, a semiconductor device includes one or more combinations of a second interlayer insulating film, a second via guard ring, and a second metal wiring guard ring, and is thus capable of accommodating a multilayer metal wiring structure.

The present invention is not limited to the specific embodiments described herein, and variations and modifications may be made without departing from the scope of the present invention.

For example, in the above-described embodiment of the present invention, the semiconductor device has a two-layer metal wiring structure. However, the semiconductor device according to an embodiment of the present invention may have a single-layer metal wiring structure or a metal wiring structure having three or more layers.

An embodiment of the present invention is applicable to a semiconductor device including a silicon fuse and a fuse opening formed in an insulating film above the silicon fuse.

The present application is based on Japanese Priority Patent Application No. 2009-230167, filed on Oct. 2, 2009, the entire contents of which are hereby incorporated herein by reference.

What is claimed is:
1. A semiconductor device comprising:
a base insulating film formed on a semiconductor substrate;
a silicon fuse formed on the base insulating film;

two silicon wiring patterns formed on the base insulating film, each of the two silicon wiring patterns being connected to either end of the silicon fuse;

a silicon guard ring formed on the base insulating film so as to surround the silicon fuse, the silicon guard ring having silicon cutout parts such that the silicon guard ring does not contact the two silicon wiring patterns;

an interlayer insulating film formed on the base insulating film so as to cover the silicon fuse, the two silicon wiring patterns, and the silicon guard ring;

a first via guard ring made of metal that is implanted into a first via hole formed in the interlayer insulating film and on the silicon guard ring so as to surround the silicon fuse as viewed from the top, the first via guard ring having via cutout parts at positions above the silicon cutout parts;

a metal wiring guard ring having a ring shape and made of metal formed on the first via guard ring and the interlayer insulating film so as to surround the silicon fuse as viewed from the top;

a silicon nitride film formed on the interlayer insulating film so as to cover the metal wiring guard ring;

a final protection film made of a final insulating film formed on the silicon nitride film; and a fuse opening provided by forming a thin part in insulating films of the semiconductor device, the thin part being formed above the silicon fuse and inside guard rings of the semiconductor device, the insulating films including at least one of the interlayer insulating film, the silicon nitride film, and the final protection film, and the guard rings including the silicon guard ring, the first via guard ring, and the metal wiring guard ring.

2. The semiconductor device according to claim 1, wherein the interlayer insulating film includes a BPSG film as a lower layer and an SOG film as an upper layer which are laminated to each other, and the nitride film is also formed on portions of the interlayer insulating film outside the guard rings.

3. The semiconductor device according to claim 1, wherein the fuse opening is formed above the silicon nitride film.

4. The semiconductor device according to claim 1, further comprising:

a second interlayer insulating film interposed between the silicon nitride film and the final protection film, the second interlayer insulating film being an inter-metal-wiring-layer insulating film;

a second via guard ring having a ring shape and made of metal that is implanted into a second via hole having a ring shape and formed in the second interlayer insulating film and above the metal wiring guard ring; and a second metal wiring guard ring having a ring shape and formed on the second via guard ring, wherein the second interlayer insulating film, the second via guard ring, and the second metal wiring guard ring form a combination, and the semiconductor device includes one or more of the combinations.

* * * * *